(12) United States Patent
Chee et al.

(10) Patent No.: US 6,514,797 B2
(45) Date of Patent: Feb. 4, 2003

(54) UNDERFILL APPLICATIONS USING FILM TECHNOLOGY

(75) Inventors: Tay L. Chee, Singapore (SG); Toh K. Seng, Singapore (SG); Tan K. Chua, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/805,915

(22) Filed: Mar. 15, 2001

(65) Prior Publication Data

US 2002/0130401 A1 Sep. 19, 2002

(51) Int. Cl.⁷ .......................... H01L 21/48; H01L 21/44
(52) U.S. Cl. ........................................ 438/127; 425/127
(58) Field of Search ................................. 438/106, 107, 438/108, 111, 112, 125, 126, 127; 425/117, 127

(56) References Cited

U.S. PATENT DOCUMENTS 5,998,242 A   12/1999   Kirkpatrick et al.
6,048,656 A   4/2000    Akram et al.
6,101,790 A   8/2000    Mori et al.
6,149,010 A   11/2000   Tanaka et al.

FOREIGN PATENT DOCUMENTS

EP     0 458 423 A2   11/1991

*Primary Examiner*—Michael Sherry
*Assistant Examiner*—Evan Pert
(74) *Attorney, Agent, or Firm*—Dickstein Shapiro Morin & Oshinsky LLP

(57) ABSTRACT

A method and apparatus are provided for assembling a semiconductor package. The invention uses a thin release film placed over package components in a mold cavity. The release film is drawn down over the assembled components and envelops the assembled components with an airtight seal around at least three sides for assisting and defining the flow of encapsulant into empty space between components. A mold compound is flowed into the empty space, assisted by vacuum or air pressure at the airtight seal. The release film is pulled up and away from the assembled components, permitting encapsulant to flow into the remainder of the mold cavity.

38 Claims, 6 Drawing Sheets

UNDERFILL APPLICATIONS USING FILM TECHNOLOGY

FIELD OF THE INVENTION

The present invention relates to assembly and manufacture of semiconductor device packages and, more particularly, to a new technique for assembling semiconductor device packages using film technology.

BACKGROUND

Semiconductor devices, for example dynamic random access memory (DRAM) devices, are shrinking in the sense that smaller devices are being manufactured that are able to handle larger volumes of data at faster data transfer rates. As a result, semiconductor manufacturers are moving toward chip-scale packages (CSP) for semiconductor components which have a small size and fine pitch wiring.

One exemplary CSP uses a chip-on-board (COB) construction whereby a semiconductor component, such as an integrated circuit (IC) chip, is attached to a base material, such as a substrate, with a conductive adhesive material. The conductive adhesive material is interposed between and bonds the IC chip and the substrate at specified locations in order to permit electrical connections between the chip and substrate. In addition, electrical traces or wiring patterns may be included in or on the substrate to permit the IC chip to connect with other external devices, for example a printed circuit board (PCB).

For example, in an exemplary COB package, solder balls may be used to bond and electrically connect the IC chip and the substrate. The solder balls may be placed at specified locations on the IC chip and/or substrate in order to form the desired electrical connections. The substrate may be attached by leads, solder balls or other electrical connectors to a PCB for use in an electronic system. Similar structures may be used in other types of semiconductor packages, such as board-on-chip ball grid array (BOC-BGA), flip chip, wafer level CSP (WLCSP), and thin small outline packages (TSOP).

Because semiconductor manufacturers are continually under pressure to reduce the size of their packages, it is generally desirable to use a small amount of adhesive between the IC chip and the substrate. Solder bumps (very small solder balls) may be used to bond the IC chip and the substrate, but the space between the IC chip and substrate is not completely filled with the adhesive, leaving a small amount of empty space adjacent the solder bumps. The resulting structure thus resembles a "sandwich," with solder bumps and empty space interposed between the IC chip and substrate. The empty space is usually filled with an "encapsulant," or a mold compound to increase the reliability of the package. The process of filling the empty space with the encapsulant is known as "underfill" of IC packages.

A problem arises in forming packages of small size, in that the gap between the IC chip and the substrate may be very small, such that the empty space may not be filled properly even when the encapsulant is applied to fill the gap using high pressure or vacuum techniques. An unfilled space between the IC chip and substrate is commonly known as a "void" and may lead to package reliability problems such as delamination or cracks. For example, the manufacturing specification for the thin small outline package (TSOP) does not allow voids larger than 10 mils to be present. However, for other packages the permissible void specification may be even more restrictive depending on the package characteristics, such as package design, mold height, and materials used. Post-encapsulation treatment may assist in eliminating the voids, but may increase the cycle time and production cost of the package.

Therefore, there is a strong need and desire for a technique for underfilling IC packages that substantially eliminates voids without significantly increasing the cycle time or production cost of the semiconductor packaging process.

SUMMARY

The invention provides a method and apparatus for producing a semiconductor package. The invention uses a thin release film placed over assembled components in a mold cavity, the assembled components including an integrated circuit (IC) chip, a substrate, and solder balls or bumps interposed between the chip and substrate. The release film is drawn down over and/or pressed against the assembled components assisted by at least one vacuum source, and pressure applied over the film using air or mechanical means. The release film thus envelops the assembled components and creates an airtight seal around at least three sides for initially confining the flow of encapsulant into the area between the chip and substrate. A mold compound or encapsulant is then flowed into the empty space between the chip and substrate, defined by vacuum and the airtight seal created by the film. The release film is then pulled up and away from the assembled components, permitting encapsulant to then flow into the remainder of the mold cavity.

In one embodiment, the mold cavity is formed to produce bare die semiconductor packages, in which, after the release film is pulled up, the encapsulant is permitted to flow around the perimeter of the IC chip but not over the top of the IC chip to form the semiconductor package.

In another embodiment, the mold cavity is formed for overmold semiconductor packages, in which, after the release film is pulled up, the encapsulant is permitted to flow around the perimeter and over the top of the IC chip to form the semiconductor package.

BRIEF DESCRIPTION OF THE DRAWINGS

The foregoing and other features and advantages of the invention will become more apparent from the detailed description of the exemplary embodiments of the invention given below with reference to the accompanying drawings in which.

DETAILED DESCRIPTION OF THE INVENTION

The invention provides a process and associated apparatus which uses a thin release film to assist in the production of semiconductor packages. While the invention is described below with reference to a chip-on-board (COB) semiconductor package, including an integrated circuit (IC) chip attached to a substrate, it should be understood that the packaging methodologies of the invention may be used with other types of semiconductor packages requiring the flow of a mold compound into small gaps, for example chip-on-board ball grid array (COB-BGA), board-on-chip ball grid array (BOC-BGA), flip chip, wafer level CSP (WLCSP), and thin small outline packages (TSOP).

Figure 1:
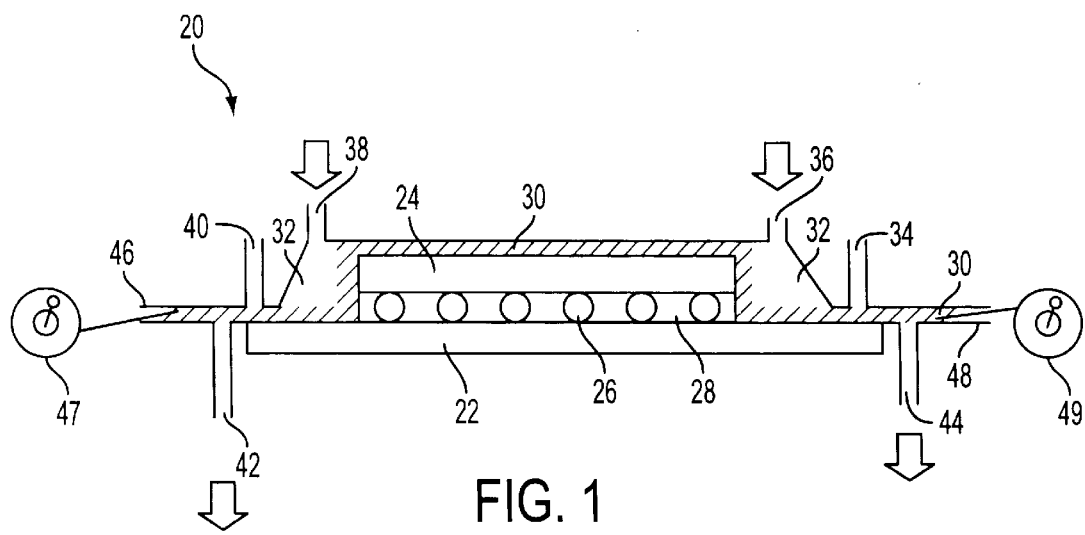
FIG. 1 illustrates a side view of a semiconductor package being formed using the apparatus and process methodologies of the invention.

Referring to FIG. 1, an exemplary packaging apparatus 20 is shown including a COB bare die semiconductor package during formation. A "sandwich" consisting of an integrated circuit (IC) chip 24, a substrate 22, and solder bumps or solder balls 26 (gold bumps, coil springs and/or other interconnect means may also be used) is shown with the solder bumps 26 interposed between the IC chip 24 and the substrate 22. The sandwich including the chip 24, substrate 22 and solder balls 26 is positioned inside the mold cavitvy 32. A thin release film 30 is also placed inside the mold cavity 32 covering the IC chip 24. The release film 30 is held in place by attachments at the periphery 46, 48 of the release film 30.

Release film handlers 47, 49 are positioned at two or more ends of the packaging apparatus 20 which bring in a new fresh layer of film 30 at the beginning of each packaging cycle. Each release film handler 47, 49 tightens the film 30 with varying forces for specified periods of time, depending on the characteristics of the package being produced. At the end of the packaging cycle, the used film 30 may be removed and discarded by the release film handlers 47, 49. The release film handlers 47, 49 may be programmable to function semi-automatically in cooperation with a controller, for example a processor system. The release film handlers 47, 49 may also be manually operated or controlled.

It may be seen in FIG. 1 that the solder balls 26 do not completely fill the gap between the chip 24 and the substrate 22, leaving a small amount of empty space 28 that may be filled with the encapsulant 29 (FIG. 3) to avoid delamination or cracks in the resulting package.

Figure 5:
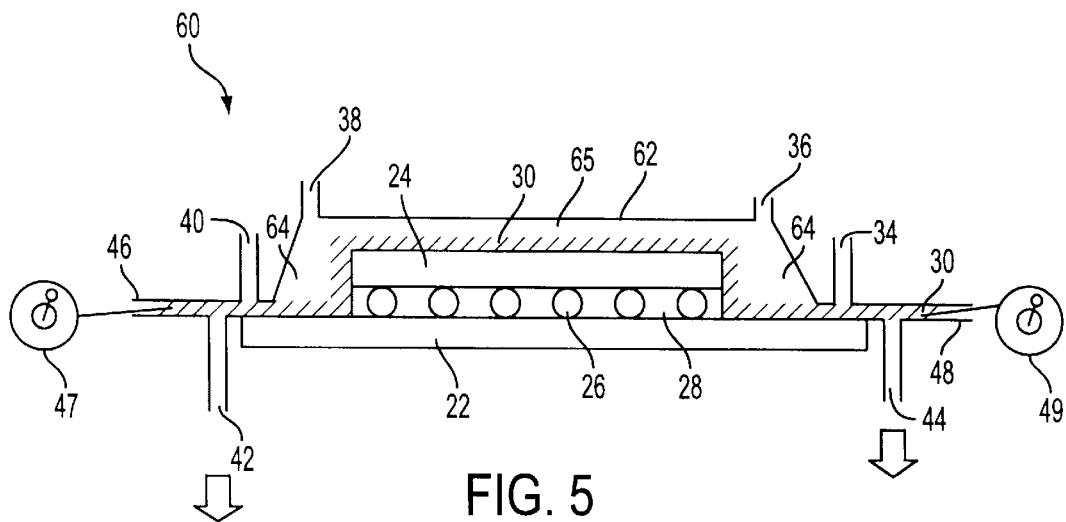
FIG. 5 illustrates a side view of a semiconductor package being formed using the apparatus and process methodologies of another embodiment of the invention.

The mold cavity walls 50 define the shape of the final package. FIGS. 1 and 5 show two exemplary embodiments of mold cavity configurations that may be used in the invention.

FIG. 1 illustrates an exemplary packaging apparatus for producing bare die packages. A bare die package is used to mount an IC chip 24 on a substrate 22, leaving the top of the chip 24 exposed for further processing, external connection to other components, or simply to dissipate heat. In the apparatus for producing bare die packages, the mold cavity walls 50 are spaced slightly away from the film 30. The release film 30 is placed over the IC chip die 24 and no empty space is present between the film 30 and the top wall 50 of the mold cavity 32.

FIG. 5 illustrates an apparatus for producing overmold packages. An overmold package is used to mount an IC chip 24 on a substrate 22 and encompass the IC chip 22 completely within the protective encapsulant 29. In the apparatus for producing overmold packages, the mold cavity walls 62 are formed to provide a specified amount of space (the "overmold space") 65 over the IC chip die 24. The release film 30 is placed over the IC chip die 24 in the overmold space 65, which separates the IC chip 24 and the top mold cavity walls 50. When the overmold space is filled with encapsulant 29 (FIG. 6), it provides a protective covering for the IC chip 24.

Referring back to FIG. 1, in operation the packaging apparatus 20 first draws the release film 30 down on the IC chip 24. FIG. 1 illustrates an exemplary system that uses air pressure and vacuum pressure to assist the drawing down of the film 30 on the chip 24. Pressure is exerted on the top side of the film 30 by forcing air into the first and second top vacuum/pressure ports 36, 38. Simultaneously, the film 30 is drawn down and air under the film 30 is removed by applying a vacuum using first and second bottom vacuum ports 44, 42. As a result, the film 30 is sucked down and stretched onto the chip-and-substrate sandwich, enveloping the chip 24 with an airtight "ring" surrounding the chip 24 on at least three sides.

Figure 10:
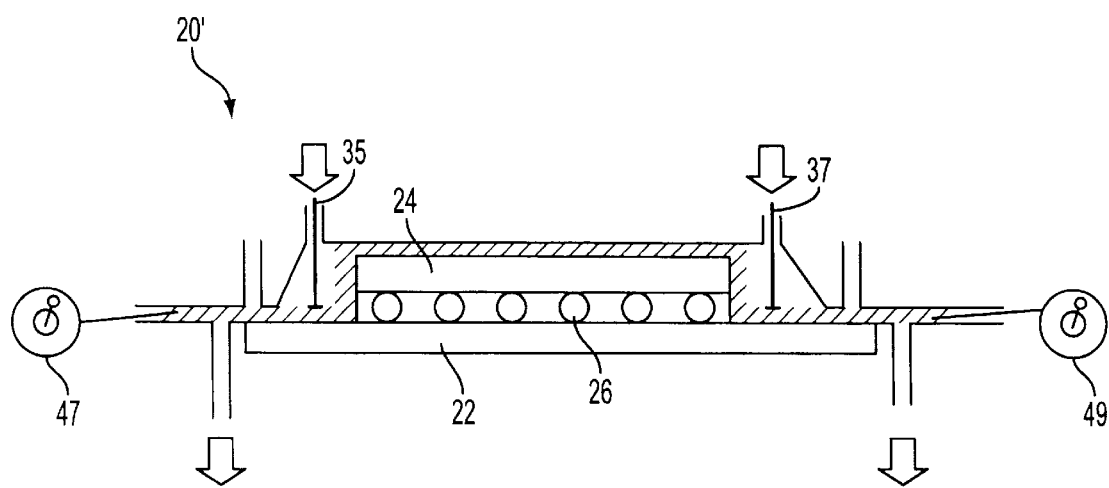
FIG. 10 illustrates a side view of a semiconductor package being formed using the apparatus and process methodologies of an alternate embodiment of the invention.

In drawing down the film 30, air pressure from the top is not required, and other means, for example mechanical pressure, may be used to similar effect. One exemplary mechanical means includes at least one arm that presses down on the film at a desired location to assist formation of the airtight "ring" before the mold is closed. An exemplary embodiment of the bare die apparatus 20' employing mechanical arms 35, 37 in accordance with the invention is shown in FIG. 10.

After the airtight "ring" is created around the chip 24 by the film 30, encapsulant 29 is permitted to flow into the empty space 28 between the IC chip 24 and the substrate 22. The encapsulant 29 flows from a source 52 on one or more sides of the mold cavity 32.

Figure 2:
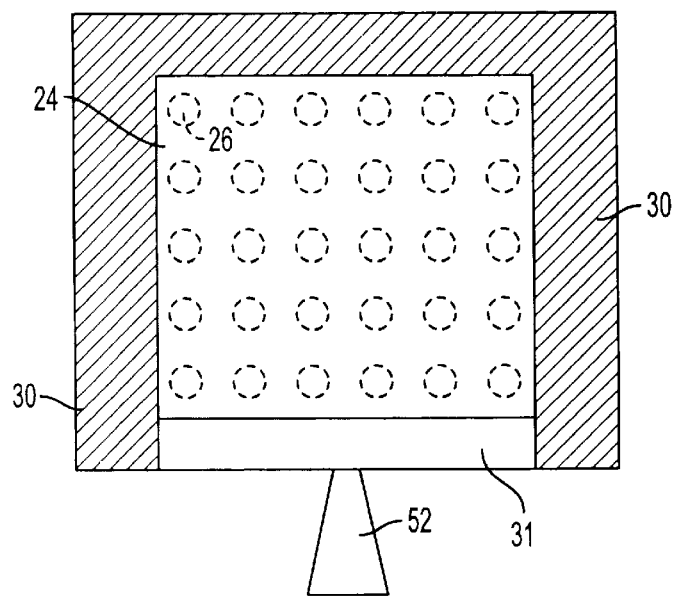
FIG. 2 illustrates a top view of the semiconductor package of FIG. 1.

FIG. 2 shows a top view of the package in the early stages of formation. The release film 30 is seen to be surrounding the IC chip 24 on at least three sides. Solder balls 26, hidden from the top view of FIG. 2, are present under the chip 24 but do not completely fill the space 28 between the chip 24 and substrate 22. A source 52 supplies the mold compound or encapsulant 29 that is permitted to flow through an entrance 31 and between the substrate 22 and the IC chip 24 to fill the space 28. The vacuum pressure exerted by the bottom vacuum ports 42, 44 assists the underfill, or flow of the encapsulant 29 into the empty space 28. This operation is continued until the empty space is packed with encapsulant 29 sufficiently to eliminate or reduce the number and size of voids which might cause reliability problems.

Figure 3:
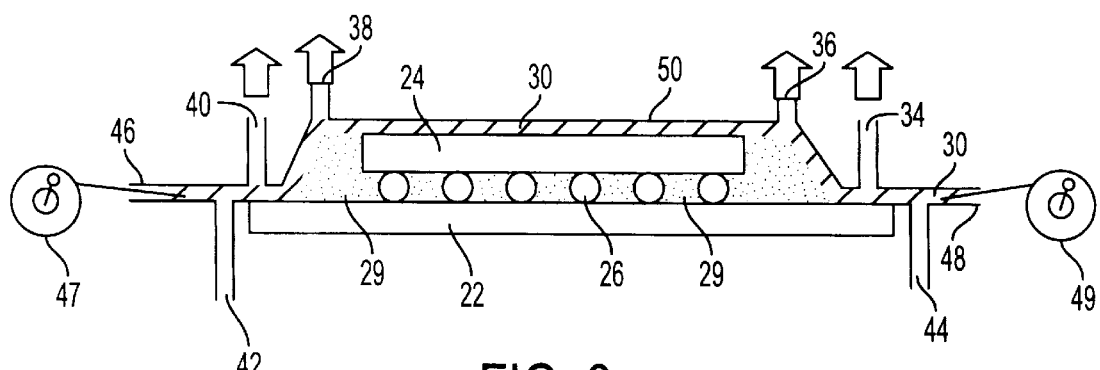
FIG. 3 illustrates a side view of the semiconductor package of FIG. 1 at a later stage of formation.
Figure 4:
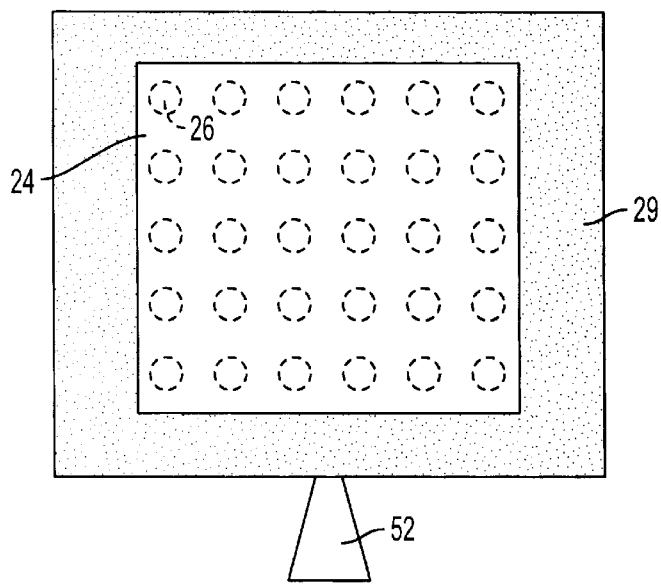
FIG. 4 illustrates a top view of the semiconductor package of FIG. 3.

After the underfill operation is completed, as shown in FIG. 3 the vacuum ports 42, 44 on the substrate side stop applying vacuum which permits a release of the film 30. Simultaneously, the vacuum ports 34, 36, 38, 40 on the chip side are activated, pulling the film 30 up and away from the substrate 22 and the chip 24. When the film 30 is released from the chip 24, the film 30 takes the shape of the mold cavity 32, thus permitting the encapsulant 29 to flow around the periphery of the IC chip 24. The resulting package takes the shape of the mold cavity walls 50. As illustrated in FIG. 4, the resulting package includes tie IC chip 24 surrounded on four sides by the encapsulant 29. FIG. 4 shows the top view of the package after the encapsulant 29 has flowed from the source 52 completely around the periphery of the IC chip 24.

Although the packaging cycle is described for release of the used release film 30 from the IC chip 24 as an act separate from flow of the encapsulant 29, this is not required. The flow of the encapsulant 29 may be uninterrupted during the packaging cycle, i.e., the film 30 is released from the IC chip 24 during flow of the encapsulant 29. Alternatively, the flow of the encapsulant 29 into the mold cavity 32 may be interrupted to permit the release film 30 to be released from the IC chip 24. For example, the flow of the encapsulant 29 into the empty space 28 between the substrate 22 and the IC chip 24 may be stopped, the film 30 may be released from the IC chip 24, and then flow of the encapsulant 29 may resume to fill the remainder of the mold cavity 32.

At the end of the process, the package is formed with the shape and size of the mold cavity 32, except that the package dimensions are determined by the mold cavity walls 50 less the thickness of the film 30. In contrast, using a conventional process, the dimensions of the package are determined only by the dimensions of the mold cavity. More importantly, the underfill area is substantially filled with the assistance of the release film and applied vacuum.

Following its use in the packaging operation, the film 30 is self released from the package and removed from the mold cavity 32 for disposal or recycling. For the next cycle of the packaging operation, a fresh layer of the release film 30 is obtained and positioned in the mold cavity 32.

The release film 30 may be any flexible, thin film compatible with semiconductor processing conditions. Typical desired properties may include: low flammability; specific electrical and mechanical properties (e.g., good elongation); very good resistance to solvents and chemicals; extremely high resistance to weathering; nonstick characteristics; good stress cracking resistance. One exemplary release film 30 that may be used is a melt processable fluoroplastic, consisting mainly of alternating tetrafluoroethylene and ethylene monomer units, that is able to withstand temperatures ranging from about −200 to 150 degrees Celsius and short term exposure (e.g., 6 to 8 hours or less) to temperatures up to 230 degrees Celsius. Two release films of this type that may be used are the Hostaflon ET6235J and Hostaflon ET6210J.

The mold compound or encapsulant 29 may be any encapsulation compound that is used in the molding, dispensing, or screen printing of IC packages. Typical properties of an appropriate encapsulant material include: low warpage; good adhesion properties with respect to the die, substrate, die attached tape and paste; good releasability from the mold die and the release film; ability to fill small gaps; good flowability; low stress; low water absorption; good reliability performance; good flexural strength; good dielectric stability; good thermal stability; low alpha emission; and low flammability.

FIG. 5 illustrates another exemplary packaging apparatus 60 including a COB overmold semiconductor package during formation. A "sandwich" consisting of an integrated circuit (IC) chip 24, a substrate 22, and solder bumps or solder balls 26 (gold bumps, coil springs and/or other interconnect means may also be used) is shown with the solder balls 26 interposed between the IC chip 24 and the substrate 22. The sandwich including the chip 24, substrate 22 and solder balls 26 is positioned inside the overmold mold cavity 64. A thin release film 30 is also placed inside the mold cavity 64 covering the IC chip 24. The release film 30 is held in place by attachments at the periphery 46, 48 of the release film 30.

Figure 6:
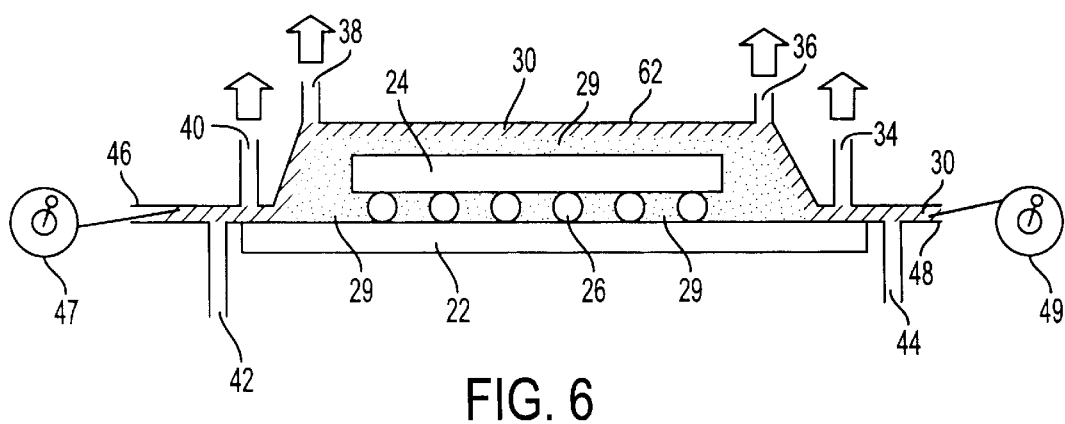
FIG. 6 illustrates a side view of the semiconductor package of FIG. 5 at a later stage of formation.

In operation, the overmold packaging apparatus 60 is operated in a manner similar to the operations of the bare die apparatus 20. The release film 30 is drawn down to create of an airtight ring around the IC chip 24 (FIG. 8), the encapsulant 29 is flowed into the empty space 28 between the chip 24 and the substrate 22 assisted by vacuum (FIG. 5), and the release film is pulled up and away from the chip 24 to permit the encapsulant 29 to flow around the periphery of the chip 24 (FIG. 6). However, in contrast to the bare die apparatus illustrated in FIGS. 1–4, the overmold apparatus 60 allows the encapsulant 29 to flow over the IC chip 24 into the overmold space 65 as well, as illustrated in FIG. 6.

Figure 8:
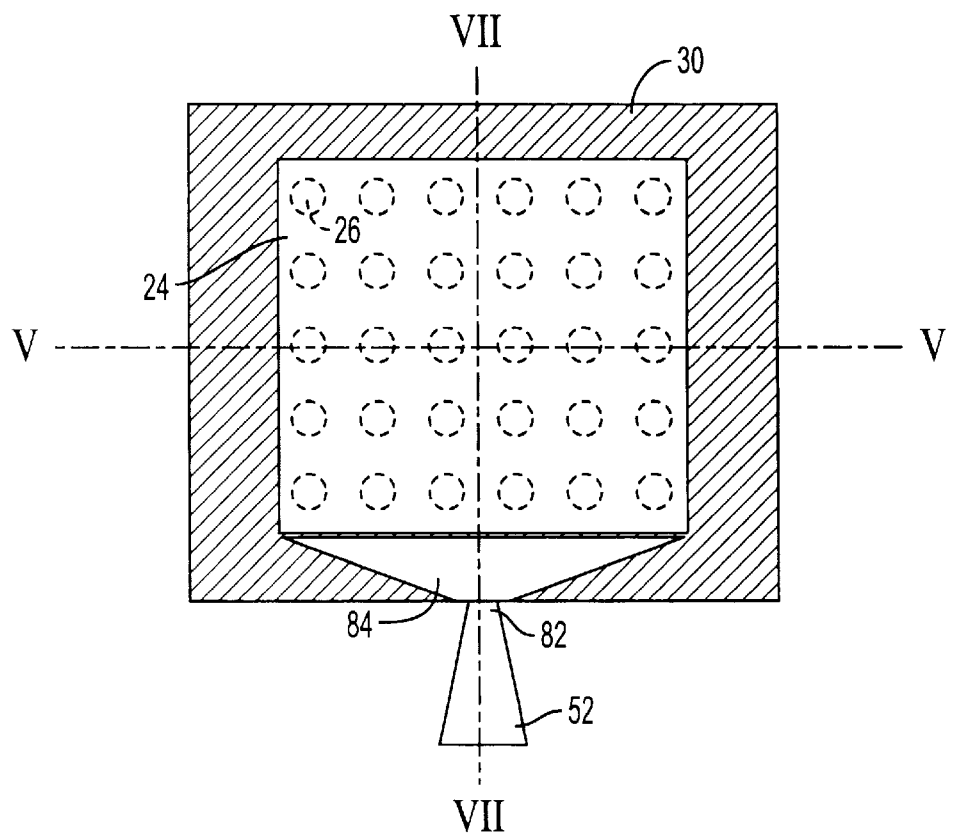
FIG. 8 illustrates a top view of the semiconductor package of FIG. 5.

FIG. 8 illustrates a top view of the exemplary apparatus 60 prior to flow of the encapsulant 29. The release film 30 is seen to be surrounding the IC chip 24 on at least three sides. Solder balls 26 (hidden lines in the top view of FIG. 8) are present under the chip 24. A source 52 supplies the mold compound or encapsulant 29 that is permitted to flow through a runner 82 and a gate 84 before it reaches the empty space 28 between the substrate 22 and the IC chip 24.

Figure 7:
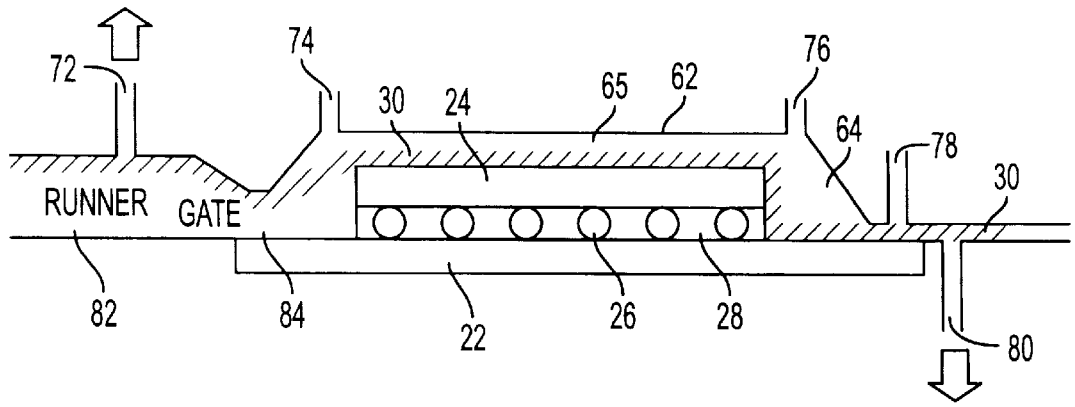
FIG. 7 illustrates a view of the cross section VII—VII illustrated in FIG. 8.

FIG. 7 illustrates a side view of the cross section VII—VII shown in FIG. 8, showing the exemplary packaging apparatus 60 prior to flow of the encapsulant 29. The encapsulant 29 enters the mold cavity 64 via the runner 82 and the gate 84. The bottom vacuum port 80 on the opposite side of the gate 84 and runner 82 is turned on to create the airtight ring around the chip 24 via the film 30. The top vacuum port 72 nearest the runner 82 is also turned on to ensure that the flow of the encapsulant 28 through the gate 84 and runner 82 is not impeded by the release film 30. Top vacuum/pressure ports 74, 76 may be used to exert pressure on the release film 30 from above to assist the formation of the airtight ring surrounding the chip 24. As noted, the encapsulant 29 then is flowed into the empty space 28 between the chip 24 and the substrate 22, and the release film 30 is pulled up and away from the chip 24 to permit the encapsulant 29 to flow around the periphery of the chip 24 and into the overmold space 65.

Figure 9:
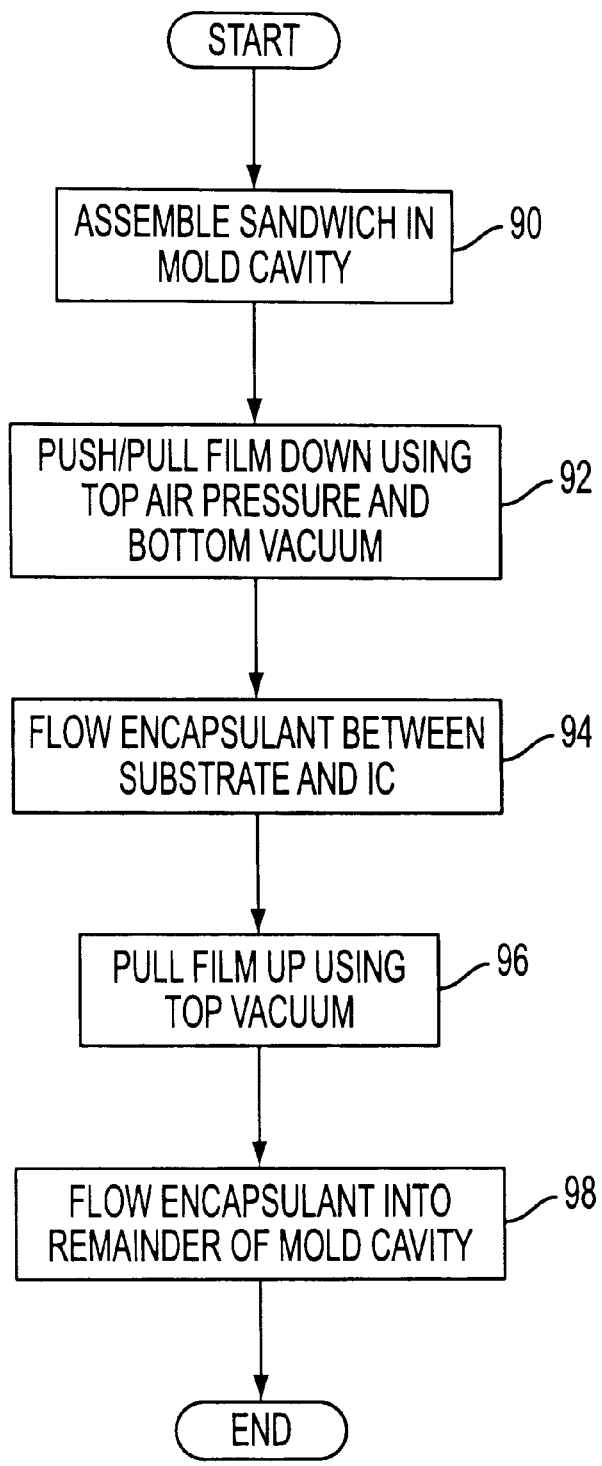
FIG. 9 is a block diagram illustrating the method of the invention.

FIG. 9 illustrates an exemplary embodiment of the method of the invention, applicable to each of the exemplary structures 20, 60 previously described with reference to FIGS. 1–4 and 5–8, respectively. The "sandwich" composed of the substrate 22, the IC chip 24, and the solder balls 26 is assembled in the mold cavity in method segment 90. The release film 30 is drawn down on the IC chip 24 in method segment 92 as noted, i.e., assisted by appropriate vacuum and/or air pressure applied using the ports 34, 36, 38, 40, 42, 44 on the top and bottom of the apparatus. The release film 30 creates an airtight "ring" around at least three sides of the chip 24 to define areas for the flow of the encapsulant 29 into the empty space 28 between the chip 24 and the substrate 22. In method segment 94, the encapsulant 29 flows into this empty space 28, assisted by the vacuum created by the lower vacuum ports 42, 44 and the release film 30. After the empty space 28 is substantially filled with encapsulant 29, the film 30 is pulled up and away from the chip 24, for example using the top and bottom vacuum ports 34, 36, 38, 40, 42, 44 in method segment 96. When pulled away from the chip 24, the film 30 takes the shape of the mold cavity walls 50. Thus the encapsulant 29 is permitted to flow into the remainder of the mold cavity 32, including around the perimeter of the chip 24.

The method and apparatus described provide a packaging methodology that allows substantially all of the empty space between a substrate and an integrated circuit chip not occupied by solder bumps or balls to be filled with encapsulant during underfill operations. The release film used in the invention creates an airtight ring around several sides of the chip and the empty space being filled, improving the flow of the encapsulant into small gaps. In this way, even very small voids may be eliminated in the encapsulant between the chip and the substrate, improving the reliability characteristics of the resulting package.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A method of assembling a semiconductor package, comprising:

forming an assembly of an integrated circuit chip on a substrate with spaced electrical connectors connecting and disposed between said integrated circuit chip and said substrate;

placing said assembly within a mold cavity and providing a release film over at least a portion of said substrate and around at least three sides of said integrated circuit chip;

causing the release film to be drawn down over said at least three sides of said integrated circuit chip and said portion of said substrate;

flowing encapsulant into empty space between said integrated circuit chip and said substrate;

causing the release film to be released from said at least three sides of said integrated circuit chip; and flowing encapsulant into an unfilled remainder of said mold cavity.

2. The method of claim 1, wherein said electrical connectors are solder bumps.

3. The method of claim 1, wherein said electrical connectors are solder balls.

4. The method of claim 1, wherein said causing the release film to be drawn down includes applying a vacuum to pull the release film down over at least said portion of said substrate.

5. The method of claim 1, wherein said causing the release film to be drawn down includes applying air pressure to the release film forcing it into contact with at least said portion of said substrate.

6. The method of claim 1, wherein causing said release film to be drawn down includes using at least one mechanical arm to exert pressure on the release film.

7. The method of claim 1, wherein causing said release film to be released includes applying a vacuum to pull the release film away from the integrated circuit and the substrate.

8. The method of claim 1, wherein the mold cavity is formed such that there is no empty space between the release film and a top wall of the mold cavity.

9. The method of claim 1, wherein the mold cavity is formed such that an overmold space is present between the integrated circuit chip and a top wall of the mold cavity.

10. The method of claim 1, wherein said flowing of said encapsulant into said empty space includes applying a vacuum to assist the flow of said encapsulant into said empty space.

11. The method of claim 1, wherein said flowing of said encapsulant into said empty space includes applying air pressure to assist the flow of said encapsulant into said empty space.

12. The method of claim 1, wherein during said flowing of said encapsulant into said empty space, said encapsulant fills substantially all of said empty space between said integrated circuit chip and said substrate.

13. The method of claim 1, wherein said flowing of said encapsulant into said unfilled remainder includes flowing encapsulant around a perimeter of said integrated circuit chip.

14. The method of claim 1, wherein said flowing of said encapsulant into said unfilled remainder includes flowing encapsulant over an upper surface of said integrated circuit chip.

15. The method of claim 1, wherein during said flowing of said encapsulant into said unfilled remainder, said encapsulant fills substantially all of said mold cavity previously unfilled.

16. The method of claim 1, wherein during said causing of said release film to be drawn down, said release film substantially envelops said integrated circuit chip to create an airtight seal around at least three sides of said empty space between said integrated circuit chip and said substrate.

17. The method of claim 1, further comprising removing said release film from said mold cavity following said flowing of said encapsulant into said unfilled remainder.

18. The method of claim 1, wherein said causing said release film to be released is performed during said flowing of said encapsulant.

19. The method of claim 1, wherein said causing said release film to be released is performed prior to said flowing of said encapsulant into said unfilled remainder.

20. The method of claim 1, wherein said flowing of said encapsulant into said empty space ceases, said release film is released from said at least three sides of said integrated circuit chip, and said flowing of said encapsulant resumes to flow into said unfilled remainder.

21. A method of assembling a bare die semiconductor package, comprising:

forming an assembly of an integrated circuit chip on a substrate with spaced electrical connectors connecting and disposed between said integrated circuit chip and said substrate;

placing said assembly within a mold cavity and providing a release film over at least a portion of said substrate and around at least three sides of said integrated circuit chip, wherein said mold cavity is formed with no empty space between a top wall of said mold cavity and said release film;

causing the release film to be drawn down over said at least three sides of said integrated circuit chip and said portion of said substrate;

flowing encapsulant into empty space between said integrated circuit chip and said substrate;

causing the release film to be released from said at least three sides of said integrated circuit chip; and flowing encapsulant into an unfilled remainder of said mold cavity.

22. A method of assembling an overmold semiconductor package, comprising:

forming an assembly of an integrated circuit chip on a substrate with spaced electrical connectors connecting and disposed between said integrated circuit chip and said substrate;

placing said assembly within a mold cavity and providing a release film over at least a portion of said substrate and around at least three sides of said integrated circuit chip, wherein said mold cavity is formed having an overmold space between a top wall of said mold cavity and said release film; causing the release film to be drawn down over said at least three sides of said integrated circuit chip and said portion of said substrate;

flowing encapsulant into empty space between said integrated circuit chip and said substrate;

causing the release film to be released from said at least three sides of said integrated circuit chip; and flowing encapsulant into an unfilled remainder of said mold cavity, including said overmold space.

23. An apparatus for filling gaps in integrated circuit packages, comprising:

a mold cavity;

a release film provided over at least a portion of a substrate and around at least three sides of an integrated circuit chip placed within said mold cavity;

at least one release film handler that inserts said release film into said mold cavity and removes said release film from said mold cavity;

a plurality of spaced electrical connectors connecting and disposed between said integrated circuit chip and said substrate; and at least one entrance in said mold cavity that permits flow of an encapsulant material into said mold cavity and between said integrated circuit chip and said substrate.

24. The apparatus of claim 23, wherein said electrical connectors are solder bumps.

25. The apparatus of claim 23, wherein said electrical connectors are solder balls.

26. The apparatus of claim 23, wherein the mold cavity is formed such that there is no empty space between the release film and a top wall of the mold cavity.

27. The apparatus of claim 23, wherein the mold cavity is formed such that an overmold space is present between the integrated circuit chip and a top wall of the mold cavity.

28. The apparatus of claim 23, further comprising upper and lower vacuum ports that assist flow of said encapsulant into said mold cavity and between said substrate and said integrated circuit chip.

29. The apparatus of claim 23, further comprising at least one air pressure port that assists flow of said encapsulant into said mold cavity and between said substrate and said integrated circuit chip.

30. The apparatus of claim 23, further comprising at least one air pressure port that assists in pressing the release film down over the integrated circuit chip and substrate.

31. The apparatus of claim 23, further comprising at least one mechanical arm that assists in pressing the release film down over the integrated circuit chip and substrate.

32. The apparatus of claim 23, wherein said release film substantially envelops said integrated circuit chip to create an airtight seal around at least three sides of said electrical connectors between said integrated circuit chip and said substrate.

33. An apparatus for filling gaps in bare die semiconductor packages, comprising:

a mold cavity having walls, said walls formed such that a space is present between a top wall of said mold cavity and an integrated circuit chip placed within said mold cavity;

a release film provided within said mold cavity, around at least three sides of said integrated circuit chip and over at least a portion of a substrate, said release film substantially filling said space;

at least one release film handler that inserts said release film into said mold cavity and removes said release film from said mold cavity;

a plurality of spaced electrical connectors connecting and disposed between said integrated circuit chip and said substrate; and at least one entrance in said mold cavity that permits flow of an encapsulant material into said mold cavity and between said integrated circuit chip and said substrate.

34. An apparatus as in claim 33, wherein said apparatus is for filling gaps in COB packages.

35. An apparatus as in claim 33, wherein said apparatus is for filling gaps in flip chip packages.

36. An apparatus for filling gaps in overmold semiconductor packages, comprising:

a mold cavity having walls, said walls formed to create an overmold space between a top wall of said mold cavity and an integrated circuit chip placed within said mold cavity;

a release film provided within said mold cavity, over at least a portion of a substrate and around at least three sides of said integrated circuit chip;

at least one release film handler that inserts said release film into said mold cavity and removes said release film from said mold cavity;

a plurality of spaced electrical connectors connecting and disposed between said integrated circuit chip and said substrate; and at least one entrance in said mold cavity that permits flow of an encapsulant material into said mold cavity and between said integrated circuit chip and said substrate.

37. An apparatus as in claim 36, wherein said apparatus is for filling gaps in COB packages.

38. An apparatus as in claim 36, wherein said apparatus is for filling gaps in flip chip packages.

* * * * *